(12) United States Patent
Hwang et al.

(10) Patent No.: US 11,608,471 B2
(45) Date of Patent: Mar. 21, 2023

(54) COMPOSITION FOR ETCHING SILICON NITRIDE FILM AND ETCHING METHOD USING SAME

(71) Applicant: SAMSUNG SDI CO., LTD., Yongin-si (KR)

(72) Inventors: Ki Wook Hwang, Suwon-si (KR); Sang Ran Koh, Suwon-si (KR); Youn Jin Cho, Suwon-si (KR); Jung Min Choi, Suwon-si (KR); Kwen Woo Han, Suwon-si (KR); Jun Young Jang, Suwon-si (KR); Yong Woon Yoon, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 56 days.

(21) Appl. No.: 17/053,143

(22) PCT Filed: Apr. 5, 2019

(86) PCT No.: PCT/KR2019/004073
§ 371 (c)(1),
(2) Date: Nov. 5, 2020

(87) PCT Pub. No.: WO2019/225856
PCT Pub. Date: Nov. 28, 2019

(65) Prior Publication Data
US 2021/0363423 A1    Nov. 25, 2021

(30) Foreign Application Priority Data

May 23, 2018    (KR) .................. 10-2018-0058654

(51) Int. Cl.
*C09K 13/06*    (2006.01)
*H01L 21/311*    (2006.01)
(52) U.S. Cl.
CPC ........ *C09K 13/06* (2013.01); *H01L 21/31111* (2013.01)
(58) Field of Classification Search
None
See application file for complete search history.

(56) References Cited

U.S. PATENT DOCUMENTS

| | | | |
|---|---|---|---|
| 10,982,144 B2* | 4/2021 | Kim | C09K 13/06 |
| 2005/0159011 A1 | 7/2005 | Thirumala et al. | |
| 2016/0130500 A1* | 5/2016 | Chen | C11D 3/3947 216/13 |
| 2016/0225616 A1* | 8/2016 | Li | H01L 21/02274 |
| 2019/0367811 A1* | 12/2019 | Lee | H01L 21/31111 |
| 2020/0071614 A1* | 3/2020 | Kim | H01L 21/31111 |

FOREIGN PATENT DOCUMENTS

| | | |
|---|---|---|
| CN | 1705767 A | 12/2005 |
| CN | 102713757 A | 10/2012 |
| CN | 104576313 A | 4/2015 |
| CN | 109837089 A | 6/2019 |
| CN | 109841511 A | 6/2019 |
| JP | 2000-058500 A | 2/2000 |
| KR | 10-1144366 B1 | 5/2012 |
| KR | 10-2014-0079267 A | 6/2014 |
| KR | 10-2015-0047068 A | 5/2015 |
| KR | 10-2016-0093551 A | 8/2016 |
| KR | 10-2018-0023086 A | 3/2018 |

OTHER PUBLICATIONS

International Search Report dated Jul. 12, 2019 for PCT/KR2019/004073.
Chinese Office Action dated May 31, 2021.

* cited by examiner

*Primary Examiner* — Shamim Ahmed
(74) *Attorney, Agent, or Firm* — Lee IP Law, P.C.

(57) ABSTRACT

An etching composition for silicon nitride comprising: a phosphoric acid compound; water; and at least one of a silane compound represented by Formula 1, below, and a reaction product thereof, and an etching method using the same are disclosed, Formula 1

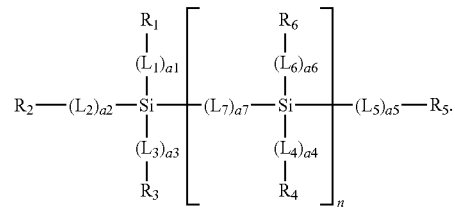

16 Claims, No Drawings

COMPOSITION FOR ETCHING SILICON NITRIDE FILM AND ETCHING METHOD USING SAME

CROSS REFERENCE TO RELATED APPLICATIONS

This is the U.S. national phase application based on PCT Application No. PCT/KR2019/004073, filed Apr. 5, 2019, which is based on Korean Patent Application No. 10-2018-0058654, filed May 23, 2018, the entire contents of all of which are hereby incorporated by reference.

TECHNICAL FIELD

The present invention relates to an etching composition for silicon nitride and an etching method using the same.

BACKGROUND ART

An inorganic thin layer such as a silicon oxide layer or a silicon nitride layer is used in various semiconductor devices or solar cells. Such a silicon oxide layer or a silicon nitride layer is generally etched by dry etching using a gas and wet etching using an etching solution. Wet etching has advantages of lower costs and higher productivity than dry etching.

In general, a mixture of phosphoric acid and water has been used as an etching solution for a silicon nitride layer. However, etching using the mixture can cause not only the silicon nitride layer but also the silicon oxide layer to be etched.

Various studies on additives to be used together with phosphoric acid are actively underway to solve such problems.

DISCLOSURE

Technical Problem

Embodiments of the present invention provide an etching composition for silicon nitride, which has a high etching selectivity for a silicon nitride layer over a silicon oxide layer, and an etching method using the same.

Technical Solution

One aspect of the present invention provides an etching composition for silicon nitride, including: a phosphoric acid compound; water; and at least one of a silane compound represented by Formula 1 and a reaction product thereof:

[Formula 1]

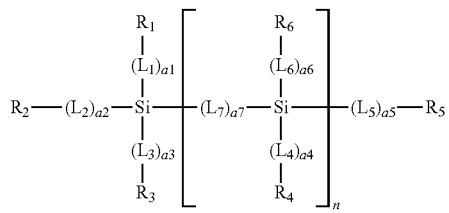

wherein Formula 1,
$L_1$ to $L_6$ are each independently selected from among *—O—*', *—S—*', *—N($R_{11}$)—*', *—C(=O)O—*', a sulfonylene group, a phosphorylene group, a phosphonylene group, an azolylene group, *—C(=O)—*', *—C(=O)—N($R_{11}$)—*', *—C(=O)—O—C(=O)—*', a $C_1$ to $C_{10}$ alkylene group, a $C_2$ to $C_{10}$ alkenylene group, a $C_2$ to $C_{10}$ alkynylene group, a $C_3$ to $C_{10}$ cycloalkylene group, a $C_1$ to $C_{10}$ heterocycloalkylene group, a $C_3$ to $C_{10}$ cycloalkenylene group, a $C_1$ to $C_{10}$ heterocycloalkenylene group, a $C_6$ to $C_{20}$ arylene group, and a $C_1$ to $C_{20}$ heteroarylene group, $L_7$ is selected from among a $C_1$ to $C_{10}$ alkylene group and a $C_6$ to $C_{20}$ arylene group, a1 to a6 are each independently selected from among integers of 0 to 10, a7 is selected from among integers of 1 to 10, $R_1$ to $R_6$ are each independently selected from among hydrogen, F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group, provided that at least one of $R_1$ to $R_6$ is selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group, $R_{11}$ to $R_{13}$ are each independently selected from among hydrogen, F, Cl, Br, I, a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group, n is selected from among integers of 1 to 10, and each of * and *' is a linking site to an adjacent atom.

In accordance with another aspect of the present invention, there is provided an etching method using the etching composition for silicon nitride.

Advantageous Effects

When etching is performed using the etching composition for silicon nitride as set forth above, an etching selectivity for a silicon nitride layer over a silicon oxide layer can be improved.

BEST MODE

As used herein, the singular forms, "a," "an," and "the" are intended to include the plural forms as well, unless the context clearly indicates otherwise.

Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Herein, a $C_1$ to $C_{10}$ heterocycloalkylene group, a $C_1$ to $C_{10}$ heterocycloalkenylene group, a $C_1$ to $C_{20}$ heteroarylene group, a $C_1$ to $C_{10}$ heterocycloalkyl group, a $C_1$ to $C_{10}$ heterocycloalkenyl group or a $C_1$ to $C_{20}$ heteroaryl group means that the corresponding group includes at least one hetero atom (for example, N, O or S) as a ring formation atom.

Herein, each of * and *' means a linking site to an adjacent atom.

Hereinafter, embodiments of the present invention will be described in detail.

In accordance with one aspect of the present invention, an etching composition for silicon nitride includes: a phosphoric acid compound; water; and at least one of a silane compound represented by Formula 1 and a reaction product thereof.

The phosphoric acid compound may be selected from among any compounds capable of providing a hydrogen ion to the etching composition for silicon nitride so as to promote etching. For example, the phosphoric acid compound may be phosphoric acid ($H_3PO_4$) or a salt thereof, phosphorous acid ($H_3PO_3$) or a salt thereof, hypophosphorous acid ($H_3PO_2$) or a salt thereof, hypophosphoric acid ($H_4P_2O_6$) or a salt thereof, tripolyphosphoric acid ($H_5P_3O_{10}$) or a salt thereof, pyrophosphoric acid ($H_4P_2O_7$) or a salt thereof, or a combination thereof. In one embodiment, the phosphoric acid compound may be phosphoric acid, without being limited thereto.

The water may be, for example, semiconductor-level water or ultrapure water, without being limited thereto.

The silane compound may be represented by Formula 1:

[Formula 1]

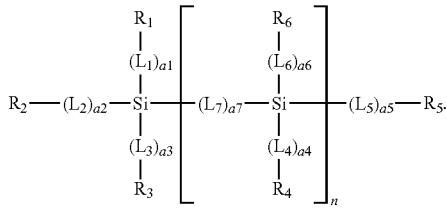

In Formula 1, where $L_1$ to $L_6$ are each independently selected from among *—O—*', *—S—*', *—N($R_{11}$)—*', *—C(=O)O—*', a sulfonylene group, a phosphorylene group, a phosphonylene group, an azolylene group, *—C(=O)—*', *—C(=O)—N($R_{11}$)—*', *—C(=O)—O—C(=O)—*', a $C_1$ to $C_{10}$ alkylene group, a $C_2$ to $C_{10}$ alkenylene group, a $C_2$ to $C_{10}$ alkynylene group, a $C_3$ to $C_{10}$ cycloalkylene group, a $C_1$ to $C_{10}$ heterocycloalkylene group, a $C_3$ to $C_{10}$ cycloalkenylene group, a $C_1$ to $C_{10}$ heterocycloalkenylene group, a $C_6$ to $C_{20}$ arylene group, and a $C_1$ to $C_{20}$ heteroarylene group, and $R_{11}$ is selected from among hydrogen, F, Cl, Br, I, a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group. For example, $L_1$ to $L_6$ may be each independently selected from among a $C_1$ to $C_{10}$ alkylene group and a $C_6$ to $C_{20}$ arylene group. In one embodiment, $L_1$ to $L_6$ may be each independently a $C_1$ to $C_{10}$ alkylene group. In another embodiment, $L_1$ to $L_6$ may be each independently selected from among a methylene group, an ethylene group, and a propylene group that are unsubstituted or substituted with at least one of a methyl group, an ethyl group and a propyl group. In yet another embodiment, $L_1$ to $L_6$ may be each independently selected from among a methylene group, an ethylene group, and a propylene group, without being limited thereto.

In Formula 1, each $L_7$ may be selected from among a $C_1$ to $C_{10}$ alkylene group and a $C_6$ to $C_{20}$ arylene group. For example, each $L_7$ may be independently a $C_1$ to $C_{10}$ alkylene group. In one embodiment, each $L_7$ may be independently selected from among a methylene group, an ethylene group, and a propylene group that are unsubstituted or substituted with at least one of a methyl group, an ethyl group and a propyl group. In another embodiment, each $L_7$ may be independently selected from among a methylene group, an ethylene group, and a propylene group, without being limited thereto.

In Formula 1, a1 to a6 are each independently selected from among integers of 0 to 10. a1 denotes the number of $L_1$. If a1 is 0, $L_1$ may be a single bond, and if a1 is an integer of 2 or more, two or more $L_1$ may be the same or different from each other. Descriptions of a2 to a6 can be understood with reference to the description of a1 and Formula 1. In one embodiment, a1 to a6 may be each independently 0, 1, 2 or 3. In another embodiment, a1 to a6 may be each independently 0 or 1, without being limited thereto.

In Formula 1, a7 is selected from among integers of 1 to 10. a7 denotes the number of $L_7$. If a7 is an integer of 2 or more, two or more $L_7$ may be the same or different from each other. In one embodiment, a7 may be 1, 2 or 3. In another embodiment, a7 may be 1, without being limited thereto.

In Formula 1, $R_u$ to $R_6$ are each independently selected from among hydrogen, F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group, provided that at least one of $R_1$ to $R_6$ is selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group, and $R_{12}$ and $R_{13}$ are each independently selected from among hydrogen, F, Cl, Br, I, a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group. For example, $R_1$ to $R_6$ may be each independently selected from among hydrogen, F, Cl, Br, I, a hydroxyl group, an amino group, *—C(=O)($R_{12}$), *—C(=O)—N($R_{12}$)($R_{13}$), a $C_1$ to $C_{10}$ alkyl group, and a $C_1$ to $C_{10}$ alkoxy group, provided that at least one of $R_1$ to $R_6$ may be selected from among F, Cl, Br, I, a hydroxyl group, an amino group, *—C(=O)($R_{12}$), *—C(=O)—N($R_{12}$)($R_{13}$), and a $C_1$ to $C_{10}$ alkoxy group, and $R_{12}$ and $R_{13}$ may be each independently selected from among hydrogen, F, Cl, Br, I, a hydroxyl group, an amino group, a $C_1$ to $C_{10}$ alkyl group, and a $C_1$ to $C_{10}$ alkoxy group. In one embodiment, $R_1$ to $R_6$ may be each independently selected from among F, Cl, Br, I, a hydroxyl group, a $C_1$ to $C_{10}$ alkyl group, and a $C_1$ to $C_{10}$ alkoxy group, provided that at least one of $R_1$ to $R_6$ may be selected from among F, Cl, Br, I, a hydroxyl group, and a $C_1$ to $C_{10}$ alkoxy group, without being limited thereto.

According to one embodiment, in Formula 1, at least two of $R_1$ to $R_6$ may be selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group (for example, from among F, Cl, Br, I, a hydroxyl group, an amino group, *—C(=O)($R_{12}$), *—C(=O)—N($R_{12}$)($R_{13}$), and a $C_1$ to $C_{10}$ alkoxy group, or from among F, Cl, Br, I, a hydroxyl group, and a $C_1$ to $C_{10}$ alkoxy group). According to another embodiment, in Formula 1, at least three of $R_1$ to $R_6$ may be selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group (for example, from among F, Cl, Br, I, a hydroxyl group, an amino group, *—C(=O)($R_{12}$), *—C(=O)—N($R_{12}$)($R_{13}$), and a $C_1$ to $C_{10}$ alkoxy group, or from among F, Cl, Br, I, a hydroxyl group, and a $C_1$ to $C_{10}$ alkoxy group). According to yet another embodiment, in Formula 1, at least four of $R_1$ to $R_6$ may be selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group (for example, from among F, Cl, Br, I, a hydroxyl group, an amino group, *—C(=O)($R_{12}$), *—C(=O)—N($R_{12}$)($R_{13}$), and a $C_1$ to $C_{10}$ alkoxy group, or from among F, Cl, Br, I, a hydroxyl group, and a $C_1$ to $C_{10}$ alkoxy group). According to yet another embodiment, in Formula 1, at least five of $R_1$ to $R_6$ may be selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group (for example, from among F, Cl, Br, I, a hydroxyl group, an amino group, *—C(=O)($R_{12}$), *—C(=O)—N($R_{12}$)($R_{13}$), and a $C_1$ to $C_{10}$ alkoxy group, or from among F, Cl, Br, I, a hydroxyl group, and a $C_1$ to $C_{10}$ alkoxy group). According to yet another embodiment, in Formula 1, $R_1$ to $R_6$ may be selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group (for example, from among F, Cl, Br, I, a hydroxyl group, an amino group, *—C(=O)($R_{12}$), *—C(=O)—N($R_{12}$)($R_{13}$), and a $C_1$ to $C_{10}$ alkoxy group, or from among F, Cl, Br, I, a hydroxyl group, and a $C_1$ to $C_{10}$ alkoxy group), without being limited thereto.

In Formula 1, n is selected from among integers of 1 to 10. If n is 2 or more, two or more $L_4$, $L_6$, $L_7$, $R_4$ and $R_6$ may be the same or different from each other. For example, n may be selected from among integers of 1 to 5. In one embodiment, n may be selected from among integers of 1 to 3. In another embodiment, n may be 1, without being limited thereto.

The silane compound may be selected from among Formulas 1 to 9, without being limited thereto:

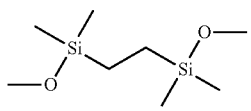

1

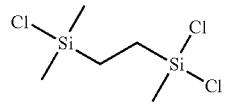

2

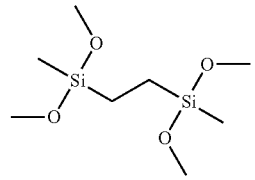

3

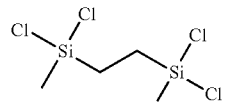

4

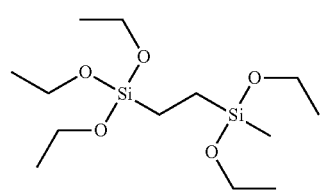

5

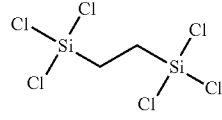

6

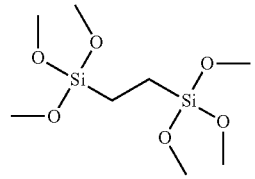

7

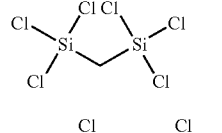

8

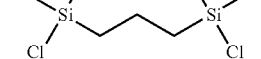

9

The reaction product means a component derived from the silane compound. For example, the reaction product may be a reaction product between the silane compounds, a reaction product between the silane compound and the phosphoric acid compound, a reaction product between the silane compound and water, a reaction product between the silane compound, the phosphoric acid compound and water, and the like. Since the silane compound represented by Formula 1 includes at least one selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group, the silane compound can react with another silane compound adjacent thereto, a phosphoric acid compound and/or water. In one example, when the silane compound includes a hydroxyl group, dehydration reaction occurs between adjacent silane compounds or between the silane compound and the phosphoric acid compound to form a reaction product including an ether bond. In another example, when the silane compound includes a halogen group or an alkoxy group, the silane compound may react with water to form a reaction product in which the halogen group or the alkoxy group of the silane compound is converted into a hydroxyl group. In addition, the silane compound containing the hydroxyl group generated through reaction with water may form a reaction product including an ether bond through dehydration reaction with an adjacent silane compound or the phosphoric acid compound. In this way, various reaction products may be easily formed through combination of the aforementioned functional groups of the silane compound, the phosphoric acid compound and/or water by a person having ordinary knowledge in the art.

According to one embodiment, the silane compound may be present in an amount of about 0.1 ppm to about 25 wt % in the etching composition for silicon nitride. For example, the silane compound may be present in an amount of about 0.001 wt % to about 25 wt %, specifically about 0.001 wt % to about 10 wt %, in the etching composition for silicon nitride. According to another embodiment, the silane compound may be present in an amount of about 0.01 wt % to about 5 wt % in the etching composition for silicon nitride. In yet another embodiment, the silane compound may be present in an amount of about 0.5 wt % to about 3 wt %, without being limited thereto. When the content of the silane compound is within this range, the etching composition for silicon nitride can have a high etching selectivity for a silicon nitride layer over a silicon oxide layer.

According to one embodiment, the etching composition for silicon nitride may include about 60 wt % to about 99.99 wt % of the phosphoric acid compound, about 0.1 ppm to about 25 wt % of the silane compound, and the balance of water. In one example, the etching composition for silicon nitride may include about 60 wt % to about 90 wt % of the phosphoric acid compound, about 0.01 wt % to about 5 wt % of the silane compound, and the balance of water. In another example, the etching composition for silicon nitride may include about 85 wt % of the phosphoric acid compound, about 0.5 wt % to about 3 wt % of the silane compound, and the balance of water, without being limited thereto. Within these content rages, the etching composition for silicon nitride can have a high etching selectivity for a silicon nitride layer over a silicon oxide layer.

According to one embodiment, the etching composition for silicon nitride may further include an organic or inorganic solvent to improve solubility of the silicon compound. The organic or inorganic solvent may be selected from any solvents typically used in the art and may include, for example, 1-methoxy-2-propanol, propylene glycol methyl ether acetate, and the like. In one embodiment, the organic or inorganic solvent may have a boiling point of 100° C. or more at 1 atm., without being limited thereto.

According to one embodiment, the etching composition for silicon nitride may further include additives typically used in the art to improve etching performance. For example, the additives may include a surfactant, a dispersion agent, and an etching rate regulator, without being limited thereto.

The etching composition for silicon nitride may have a higher etching selectivity for a silicon nitride layer over a silicon oxide layer than an etching composition not containing the silane compound. According to one embodiment, the etching composition for silicon nitride may have an etching selectivity of 16 or more, as calculated by Equation 1:

$$\text{Etching selectivity} = A/B \qquad \text{[Equation 1]}$$

wherein Equation 1, A denotes an etching rate of the etching composition with respect to a silicon nitride layer per unit time (unit: Å/min) and B denotes an etching rate of the etching composition with respect to a silicon oxide layer per unit time (unit: Å/min). For example, the etching composition for silicon nitride may have an etching selectivity of 25 or more. In another example, the etching composition for silicon nitride may have an etching selectivity of 100 or more. In a further example, the etching composition for silicon nitride may have an etching selectivity of 400 or more, without being limited thereto.

In the etching composition including the silane compound, which includes at least one substituent group selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), —C(=O)—N($R_{12}$)($R_{13}$), *—C(=O)—O—C(=O)($R_{12}$), and a $C_1$ to $C_{10}$ alkoxy group, the silane compound is selectively coupled to an upper surface of the silicon oxide layer to protect the silicon oxide layer, thereby enabling selective etching with respect to the silicon nitride layer alone. Further, Si atoms in the silane compound are connected to each other by a $C_1$ to $C_{10}$ alkylene group or a $C_6$ to $C_{20}$ arylene group, thereby providing higher stability than the case where Si atoms are coupled by a single bond.

The etching composition for silicon nitride may be prepared by mixing the phosphoric acid compound, water and the silane compound represented by Formula 1. In one example, the etching composition for silicon nitride may be prepared by mixing about 60 wt % to about 99.99 wt % of the phosphoric acid compound, about 0.1 ppm to about 25 wt % of the silane compound, and the balance of water. In another example, the etching composition for silicon nitride may be prepared by mixing about 60 wt % to about 90 wt % of the phosphoric acid compound, about 0.01 wt % to about 5 wt % of the silane compound, and the balance of water. In a further example, the etching composition for silicon nitride may be prepared by mixing about 85 wt % of the phosphoric acid compound, about 0.5 wt % to about 3 wt % of the silane compound, and the balance of water, without being limited thereto.

In accordance with another aspect of the present invention, an etching method using the etching composition for silicon nitride is provided.

The etching method may include, for example, forming a silicon nitride layer or the silicon oxide layer on a substrate; etching the silicon nitride layer or the silicon oxide layer by applying the etching composition thereto; and removing the etching composition after etching.

The substrate may be selected from any substrates typically used in the art, and may be, for example, a semiconductor wafer.

The step of etching the silicon nitride layer or the silicon oxide layer by applying the etching composition thereto may include, for example, dipping the silicon nitride layer or the silicon oxide layer in an etching bath containing the etching composition, or spraying the etching composition onto the silicon nitride layer or the silicon oxide layer, without being limited thereto.

According to one embodiment, the etching method may further include heating the etching composition for silicon nitride before etching the silicon nitride layer or the silicon oxide layer, in which the etching composition may be heated to a temperature of about 100° C. or more, for example, about 100° C. to about 500° C. According to one embodiment, the etching composition for silicon nitride may be heated to about 150° C. to about 300° C., without being limited thereto.

The step of removing the etching composition after etching may include, for example, cleaning the etching composition with ultrapure water, followed by drying the silicon oxide layer or the silicon nitride layer, without being limited thereto.

The etching method using the etching composition for silicon nitride improves an etching selectivity for a silicon nitride layer over a silicon oxide layer without abnormal growth of the silicon oxide layer due to accumulation of silane-based additives on the silicon oxide layer and does not allow generation of precipitates through reaction between the silane-based additives after etching.

Next, the present invention will be described in more detail with reference to some examples. In the following example, it should be noted that the weight of A is the same as the weight of B in the expression "B was used instead of A".

EXAMPLE

Example 1

An etching composition for silicon nitride comprising 85 wt % of phosphoric acid, 0.5 wt % of silane compound 1 and the balance of water was prepared.

Examples 2 to 11 and Comparative Examples 1 to 4

Each of etching compositions for silicon nitride was prepared in the same manner as in Example 1 except that different compounds were used in amounts as listed in Table 1 instead of the silane compound 1.

Evaluation Example 1

Each of the etching compositions for silicon nitride prepared in Examples 1 to 11 and Comparative Examples 1 to 4 was heated to 160° C., followed by etching an LP-SiN layer or a PE—SiO layer using the etching composition for 5 min. Thickness of the LP-SiN layer or the PE-SiO layer was measured using an ellipsometer before and after etching, followed by calculating etching selectivity for the silicon nitride layer over the silicon oxide layer, and results are shown in Table 1.

Evaluation Example 2

Each of the etching compositions for silicon nitride prepared in Examples 1 to 11 and Comparative Examples 1 to 4 was heated to 160° C., followed by etching an LP-SiN layer or a PE—SiO layer using the etching composition for 5 min. After etching, the composition was placed in a vial, followed by measurement of transmittance at 880 nm using a Turbiscan to confirm the presence of precipitates in the composition, and results are shown in Table 1.

TABLE 1

| | Silane compound (wt %) | Etching rate of silicon nitride layer (Å/min) | Etching rate of silicon oxide layer (Å/min) | Etching selectivity | Presence of precipitates |
|---|---|---|---|---|---|
| Example 1 | Compound 1 (0.5 wt %) | 58.1 | 3.6 | 16.1 | Absent |
| Example 2 | Compound 2 (0.5 wt %) | 58.3 | 3.1 | 18.8 | Absent |
| Example 3 | Compound 3 (0.5 wt %) | 57.8 | 2.2 | 26.3 | Absent |
| Example 4 | Compound 4 (0.5 wt %) | 56.4 | 0.5 | 112.8 | Absent |
| Example 5 | Compound 5 (0.5 wt %) | 57.6 | 0.14 | 411 | Absent |
| Example 6 | Compound 6 (0.5 wt %) | 55.2 | 0.08 | 690.0 | Absent |
| Example 7 | Compound 6 (1.0 wt %) | 55.0 | 0.07 | 785.7 | Absent |
| Example 8 | Compound 6 (3.0 wt %) | 54.8 | 0.05 | 1096 | Absent |
| Example 9 | Compound 7 (0.5 wt %) | 55.4 | 0.06 | 923.3 | Absent |
| Example 10 | Compound 8 (0.5 wt %) | 56.1 | 0.1 | 561.0 | Absent |
| Example 11 | Compound 9 (0.5 wt %) | 56.3 | 0.12 | 469.2 | Absent |
| Comparative Example 1 | No | 60.4 | 4.3 | 14.0 | Absent |
| Comparative Example 2 | Compound A (0.5 wt %) | 59.6 | Abnormal growth | N/A | Present |
| Comparative Example 3 | Compound B (0.5 wt %) | 60.2 | 4.3 | 14.0 | Absent |
| Comparative Example 4 | Compound C (0.5 wt %) | 60.5 | 4.4 | 13.8 | Absent |

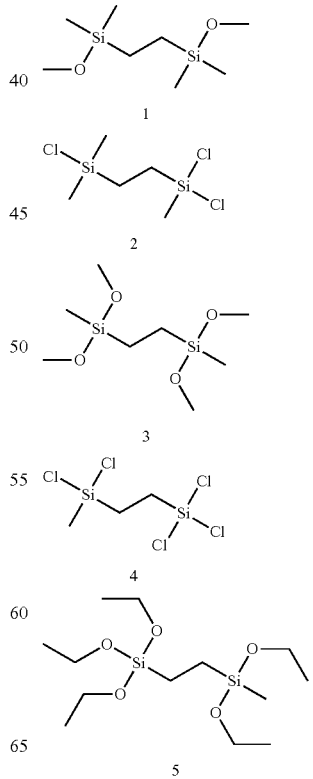

TABLE 1-continued

| Silane compound (wt %) | Etching rate of silicon nitride layer (Å/min) | Etching rate of silicon oxide layer (Å/min) | Etching selectivity | Presence of precipitates |
|---|---|---|---|---|

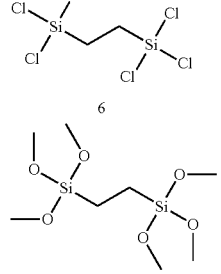

From Table 1, it could be seen that the etching compositions for silicon nitride prepared in Examples 1 to 11 had a higher etching selectivity for the silicon nitride layer over the silicon oxide layer than the etching compositions of Comparative Examples 1 to 4.

In addition, it could be seen that the etching composition for silicon nitride prepared in Examples 1 to 11 did not cause abnormal growth of silicon oxide and generation of precipitates.

It should be understood that various modifications, changes, alterations, and equivalent embodiments can be made by those skilled in the art without departing from the spirit and scope of the present invention.

The invention claimed is:

1. An etching composition for silicon nitride, comprising:
   a phosphoric acid compound;
   water; and
   at least one of a silane compound represented by Formula 1 and a reaction product thereof:

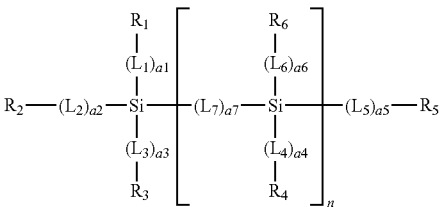

[Formula 1]

wherein Formula 1, $L_1$ to $L_6$ are each independently selected from among *—O—*', *—S—*', *—N($R_{11}$)—*', *—C(=O)O—*', a sulfonylene group, a phosphorylene group, a phosphonylene group, an azolylene group, *—C(=O)—*', *—C(=O)—N($R_{11}$)—*', *—C(=O)—O—C(=O)—*', a $C_1$ to $C_{10}$ alkylene group, a $C_2$ to $C_{10}$ alkenylene group, a $C_2$ to $C_{10}$ alkynylene group, a $C_3$ to $C_{10}$ cycloalkylene group, a $C_1$ to $C_{10}$ heterocycloalkylene group, a $C_3$ to $C_{10}$ cycloalkenylene group, a $C_1$ to $C_{10}$ heterocycloalkenylene group, a $C_6$ to $C_{20}$ arylene group, and a $C_1$ to $C_{20}$ heteroarylene group;

$L_7$ is selected from among a $C_1$ to $C_{10}$ alkylene group and a $C_6$ to $C_{20}$ arylene group;

a1 to a6 are each independently selected from among integers of 0 to 10;

a7 is selected from among integers of 1 to 10, $R_1$ to $R_6$ are each independently selected from among hydrogen, F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group, provided that at least one of $R_1$ to $R_6$ is selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group;

$R_{11}$ to $R_{13}$ are each independently selected from among hydrogen, F, Cl, Br, I, a $C_1$ to $C_{10}$ alkyl group, a $C_2$ to $C_{10}$ alkenyl group, a $C_2$ to $C_{10}$ alkynyl group, a $C_1$ to $C_{10}$ alkoxy group, a $C_3$ to $C_{10}$ cycloalkyl group, a $C_1$ to $C_{10}$ heterocycloalkyl group, a $C_3$ to $C_{10}$ cycloalkenyl group, a $C_1$ to $C_{10}$ heterocycloalkenyl group, a $C_6$ to $C_{20}$ aryl group, and a $C_1$ to $C_{20}$ heteroaryl group;

n is selected from among integers of 1 to 10; and each of * and *' is a linking site to an adjacent atom.

2. The etching composition for silicon nitride according to claim 1, wherein the phosphoric acid compound is phosphoric acid ($H_3PO_4$) or a salt thereof, phosphorous acid ($H_3PO_3$) or a salt thereof, hypophosphorous acid ($H_3PO_2$) or a salt thereof, hypophosphoric acid ($H_4P_2O_6$) or a salt thereof, tripolyphosphoric acid ($H_5P_3O_{10}$) or a salt thereof, pyrophosphoric acid ($H_4P_2O_7$) or a salt thereof, or a combination thereof.

3. The etching composition for silicon nitride according to claim 1, wherein $L_7$ is selected from among a methylene group, an ethylene group, and a propylene group that are unsubstituted or substituted with at least one of a methyl group, an ethyl group and a propyl group.

4. The etching composition for silicon nitride according to claim 1, wherein:
   $R_1$ to $R_6$ are each independently selected from among hydrogen, F, Cl, Br, I, a hydroxyl group, an amino group, *—C(=O)($R_{12}$), *—C(=O)—N($R_{12}$)($R_{13}$), a $C_1$ to $C_{10}$ alkyl group, and a $C_1$ to $C_{10}$ alkoxy group, provided that at least one of $R_1$ to $R_6$ is selected from among F, Cl, Br, I, a hydroxyl group, an amino group, *—C(=O)($R_{12}$), *—C(=O)—N($R_{12}R_{13}$), and a $C_1$ to $C_{10}$ alkoxy group, and
   $R_{12}$ and $R_{13}$ are each independently selected from among hydrogen, F, Cl, Br, I, a hydroxyl group, an amino group, a $C_1$ to $C_{10}$ alkyl group, and a $C_1$ to $C_{10}$ alkoxy group.

5. The etching composition for silicon nitride according to claim 1, wherein $R_1$ to $R_6$ are each independently selected from among F, Cl, Br, I, a hydroxyl group, a $C_1$ to $C_{10}$ alkyl group, and a $C_1$ to $C_{10}$ alkoxy group, provided that at least one of $R_1$ to $R_6$ is selected from among F, Cl, Br, I, a hydroxyl group, and a $C_1$ to $C_{10}$ alkoxy group.

6. The etching composition for silicon nitride according to claim 1, wherein at least two of $R_1$ to $R_6$ are selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group.

7. The etching composition for silicon nitride according to claim 1, wherein at least five of $R_1$ to $R_6$ are selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group.

8. The etching composition for silicon nitride according to claim 1, wherein $R_1$ to $R_6$ are selected from among F, Cl, Br, I, a hydroxyl group, a thiol group, a cyano group, an amino group, a carboxyl group, a sulfonic acid group, a phosphoric group, a phosphonic group, an azole group, *—C(=O)($R_{12}$), *—C(=O)—N($R_{12}$)($R_{13}$), *—C(=O)—O—C(=O)($R_{12}$), and a $C_1$ to $C_{10}$ alkoxy group.

9. The etching composition for silicon nitride according to claim 1, wherein n is 1.

10. The etching composition for silicon nitride according to claim 1, wherein the silane compound is selected from among Compounds 1 to 9:

1
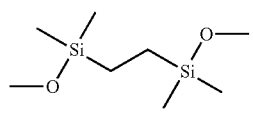

2
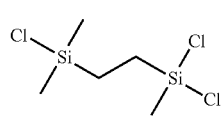

3
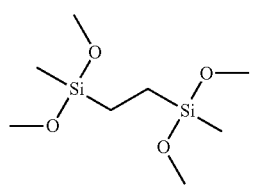

4
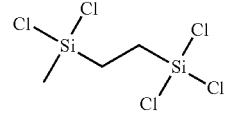

5
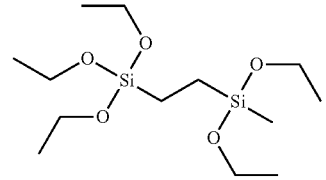

6
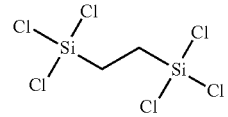

7
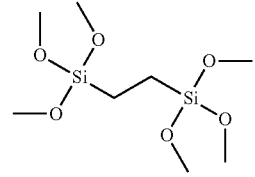

8
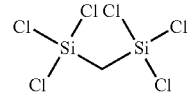

9
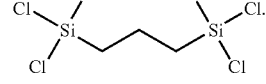

11. The etching composition for silicon nitride according to claim 1, wherein the silane compound is present in an amount of about 0.1 ppm to about 25 wt % in the etching composition for silicon nitride.

12. The etching composition for silicon nitride according to claim 1, comprising:
   about 60 wt % to about 99.99 wt % of the phosphoric acid compound;
   about 0.1 ppm to about 25 wt % of the silane compound; and
   the balance of water.

13. The etching composition for silicon nitride according to claim 1, wherein the etching composition has an etching selectivity of 16 or more, as calculated by Equation 1:

$$\text{Etching selectivity} = A/B \quad \text{[Equation 1]}$$

wherein Equation 1, A denotes an etching rate of the etching composition with respect to a silicon nitride layer per unit time (unit: Å/min) and B denotes an etching rate of the etching composition with respect to a silicon oxide layer per unit time (unit: Å/min).

14. The etching composition for silicon nitride according to claim 13, wherein the etching selectivity is 100 or more.

15. The etching composition for silicon nitride according to claim 14, wherein the etching selectivity is 400 or more.

16. An etching method using the etching composition for silicon nitride according to claim 1.

* * * * *